(12) United States Patent
Kamiya et al.

(10) Patent No.: US 12,150,324 B2
(45) Date of Patent: Nov. 19, 2024

(54) ORGANIC DEVICE WITH PIXELS

(71) Applicant: Japan Display Inc., Tokyo (JP)

(72) Inventors: Akinori Kamiya, Tokyo (JP); Kota Makishi, Tokyo (JP)

(73) Assignee: Japan Display Inc., Tokyo (JP)

( * ) Notice: Subject to any disclaimer, the term of this patent is extended or adjusted under 35 U.S.C. 154(b) by 103 days.

(21) Appl. No.: 17/537,645

(22) Filed: Nov. 30, 2021

(65) Prior Publication Data

US 2022/0093888 A1 Mar. 24, 2022

Related U.S. Application Data

(63) Continuation of application No. 15/919,345, filed on Mar. 13, 2018, now Pat. No. 11,205,760.

(30) Foreign Application Priority Data

Apr. 12, 2017 (JP) .................................. 2017-078809

(51) Int. Cl.
*H10K 50/11* (2023.01)
*G09G 3/3208* (2016.01)
(Continued)

(52) U.S. Cl.
CPC ........... *H10K 50/11* (2023.02); *G09G 3/3208* (2013.01); *G09G 3/3233* (2013.01); *H10K 50/15* (2023.02);
(Continued)

(58) Field of Classification Search
CPC .... H10K 50/11; H10K 50/8445; H10K 50/16; H10K 50/818; H10K 50/844;
(Continued)

(56) References Cited

U.S. PATENT DOCUMENTS

2014/0367661 A1* 12/2014 Akagawa ............. H10K 50/844
 438/26
2016/0111677 A1* 4/2016 Hong ................. H10K 50/8426
 257/40

(Continued)

FOREIGN PATENT DOCUMENTS

JP 2008242307 * 10/2008

*Primary Examiner* — Sheng-Bai Zhu
(74) *Attorney, Agent, or Firm* — Michael Best & Friedrich LLP

(57) ABSTRACT

A display device includes a substrate, a plurality of pixels above the substrate, each of the plurality of pixels including a first electrode, a light emitting layer above the first electrode, and a second electrode above the light emitting layer, a display region including the plurality of pixels, a first organic insulating layer located between the substrate and the light emitting layer, and a sealing layer above the second electrode and covering the plurality of pixels. The first organic insulating layer includes a first opening part surrounding the display region, the sealing layer has a first inorganic insulating layer, a second organic insulating layer and a second inorganic insulating layer, the first inorganic insulating layer and the second inorganic insulating layer cover the first opening part, a second opening part passing through the first inorganic insulating layer and the second inorganic insulating layer.

6 Claims, 10 Drawing Sheets

(51) Int. Cl.
  *G09G 3/3233* (2016.01)
  *H10K 50/15* (2023.01)
  *H10K 50/16* (2023.01)
  *H10K 50/17* (2023.01)
  *H10K 50/818* (2023.01)
  *H10K 50/82* (2023.01)
  *H10K 50/84* (2023.01)
  *H10K 50/844* (2023.01)
  *H10K 59/122* (2023.01)
  *H10K 59/124* (2023.01)
  *H10K 59/173* (2023.01)
  *H10K 71/00* (2023.01)

(52) U.S. Cl.
  CPC ........... *H10K 50/16* (2023.02); *H10K 50/171* (2023.02); *H10K 50/818* (2023.02); *H10K 50/82* (2023.02); *H10K 50/844* (2023.02); *H10K 50/8445* (2023.02); *H10K 59/122* (2023.02); *H10K 59/124* (2023.02); *H10K 59/173* (2023.02); *H10K 71/00* (2023.02); *G09G 2300/0426* (2013.01); *H10K 50/841* (2023.02); *H10K 71/851* (2023.02)

(58) Field of Classification Search
  CPC .... H10K 50/841; H10K 50/171; H10K 50/15; H10K 50/82; H10K 59/122; H10K 59/173; H10K 59/124; H10K 71/00; G09G 3/3208; G09G 3/3233
  USPC .......................................................... 257/40
  See application file for complete search history.

(56) References Cited

U.S. PATENT DOCUMENTS

| | | | |
|---|---|---|---|
| 2016/0211310 A1* | 7/2016 | Wang | H10K 50/865 |
| 2016/0365398 A1* | 12/2016 | Kim | H10K 50/8426 |
| 2017/0117502 A1* | 4/2017 | Park | H10K 59/124 |
| 2017/0365812 A1* | 12/2017 | Choung | H10K 50/15 |
| 2018/0095571 A1* | 4/2018 | Park | H10K 50/805 |
| 2018/0166525 A1* | 6/2018 | Kim | G01N 27/20 |
| 2020/0106050 A1* | 4/2020 | Jeong | H10K 50/8445 |

* cited by examiner

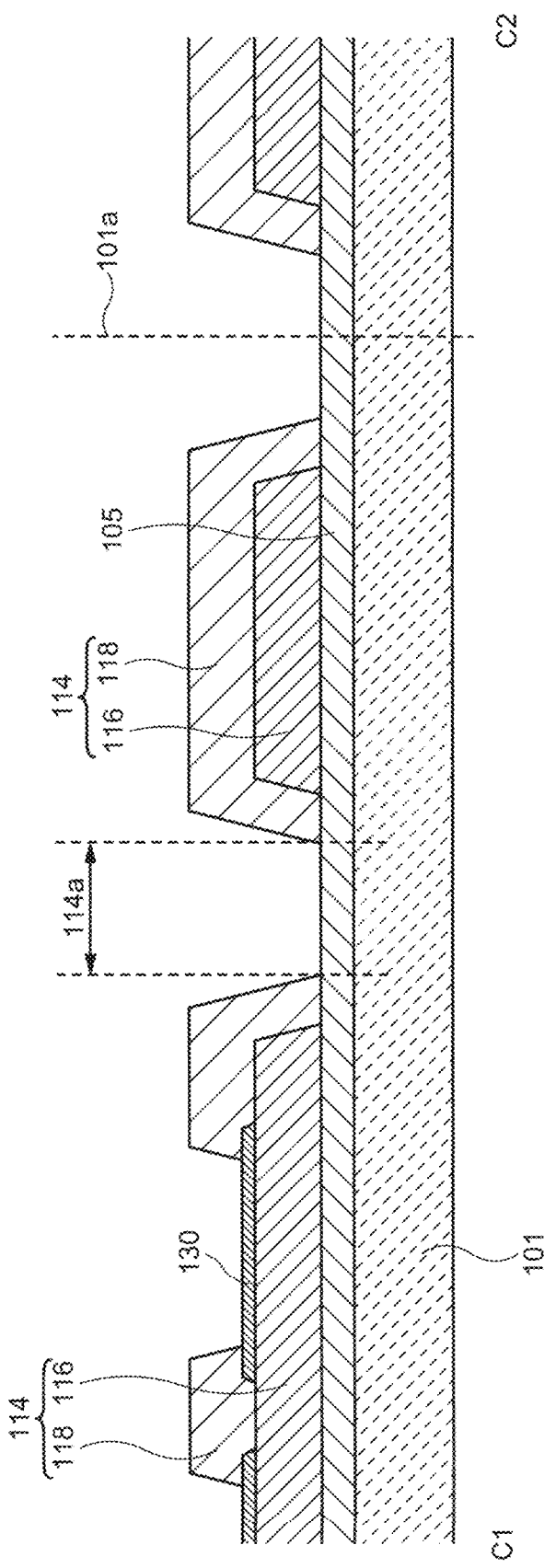

ORGANIC DEVICE WITH PIXELS

CROSS REFERENCE TO RELATED APPLICATIONS

This application is a continuation of U.S. patent application Ser. No. 15/919,345, filed on Mar. 13, 2018. Further, this application is based upon and claims the benefit of priority from the prior Japanese Patent Application No. 2017-078809, filed on Apr. 12, 2017, the entire contents of which are incorporated herein by reference.

FIELD

An embodiment of the present invention is related to a sealing structure of a display device and a manufacturing method of a display device having a sealing layer.

BACKGROUND

An organic electroluminescence display device (referred to herein as "organic EL") is arranged with a light emitting element in each pixel and displays an image by individually controlling emitted light. A light emitting element has a structure in which a layer (also called a "light emitting layer" herein) including an organic EL material is sandwiched between a pair of electrodes wherein one is an anode and the other is a cathode. When electrons are injected into the light emitting layer from the cathode and holes are injected from the anode, the electrons and holes recombine. Light emitting molecules in the light emitting layer are excited by the energy releases by recombination and light is emitted by photons emitted when the excitons return to the ground state.

An organic EL display device, each anode of a light emitting element is arranged as a pixel electrode in each pixel, and the cathode is arranged extending a plurality of pixels as a common pixel electrode and is applied with a common potential. The organic EL display device controls light emitted from a pixel by applying the voltage of a pixel electrode to each pixel with respect to the potential of the common pixel electrode.

A light emitting layer of an organic EL device easily degradation due to moisture, and non-lighting regions called dark spots are produced. Thus, in order to solve such a problem, many organic EL display devices are arranged with a sealing layer to prevent the entrance of moisture.

However, there is a problem whereby micro-cracks are generated in an inorganic film of the sealing layer when a plurality of organic EL display devices arranged on a mother glass are divided in the manufacturing process. When micro-cracks are generated in an inorganic film of a sealing layer, it becomes a moisture intrusion path and moisture easily intrudes into the light emitting layer.

In response to such a problem, for example, Japanese Laid Open Patent Application Publication No. 2015-041481 discloses a manufacturing method in which an organic layer is present between a first inorganic layer and a second inorganic layer at a cutting position, absorbs stress at the time of cutting which prevents the generation of cracks.

SUMMARY

A display device in an embodiment according to the present invention includes a substrate, a plurality of pixels above the substrate, each of the plurality of pixels including a first electrode, a light emitting layer above the first electrode, and a second electrode above the light emitting layer, a display region including the plurality of pixels, a first organic insulating layer located between the substrate and the light emitting layer, and a sealing layer above the second electrode and covering the plurality of pixels. The first organic insulating layer includes a first opening part surrounding the display region, the sealing layer has a stacked structure, the stacked structure is stacked with a first inorganic insulating layer, a second organic insulating layer and a second inorganic insulating layer from the substrate side, the first inorganic insulating layer and the second inorganic insulating layer cover the first opening part, an end part of the first inorganic insulating layer and an end part of the second inorganic insulating layer are located in a first region which is an opposite side of the first opening part from the display region, the first region includes a second region where the first inorganic insulating layer directly contacts the second inorganic insulating layer, and the second region includes a second opening part passing through the first inorganic insulating layer and the second inorganic insulating layer.

A display device in an embodiment according to the present invention includes a substrate, a plurality of pixels above the substrate, a display region including the plurality of pixels, a periphery region at an outer side of the display region, an inorganic insulating layer covering the plurality of pixels and located over the display region and the periphery region, an organic insulating layer located on a substrate side of the inorganic insulating layer and located in the periphery region, and an opening part located above the organic insulating layer in the periphery region and passing through the inorganic insulating layer.

BRIEF DESCRIPTION OF DRAWINGS

FIG. 6A is a cross-sectional diagram for explaining a manufacturing method of a display device related to one embodiment of the present invention;

DESCRIPTION OF EMBODIMENTS

A display device according to one embodiment of the present invention is explained below while referring to the diagrams. Furthermore, it is possible to perform the present invention using various aspects, and the present invention should not be limited to the content described in the embodiments exemplified herein. In the embodiments exemplified herein, the same reference symbols are attached to the same structural elements. In addition, for the purposes of explanation, the dimension ratios of the drawings may be different to actual ratios and parts of the structures may be omitted from the drawings.

Figure 1:
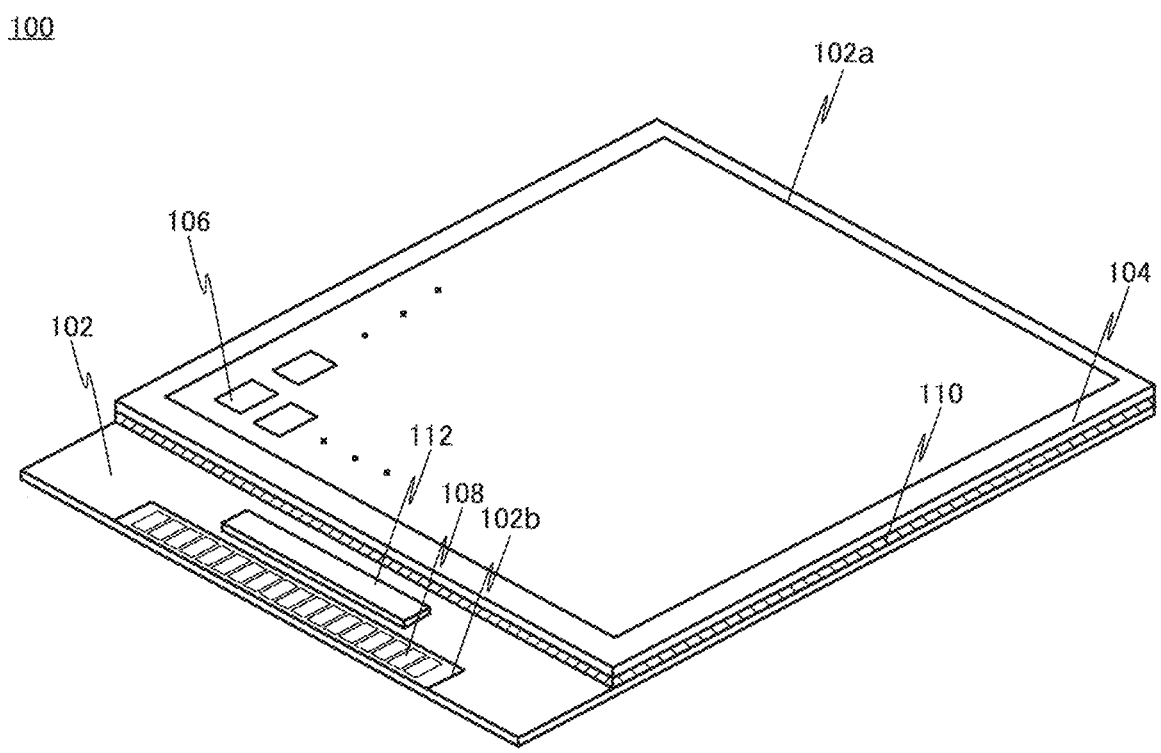
FIG. 1 is a perspective diagram for explaining an outline structure of a display device related to one embodiment of the present invention.
Figure 2:
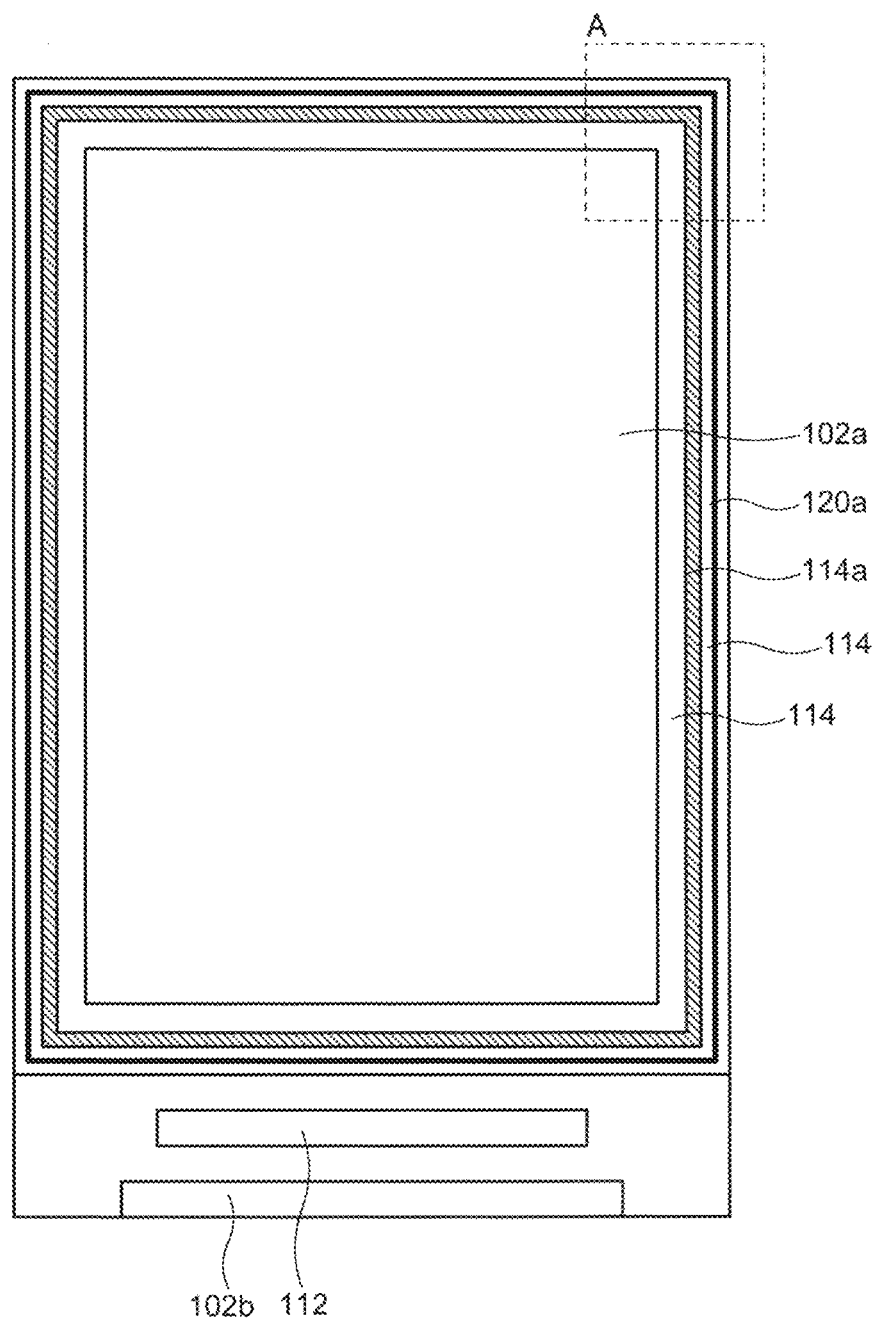
FIG. 2 is a planar diagram for explaining a structure of a display device related to one embodiment of the present invention.
Figure 3:
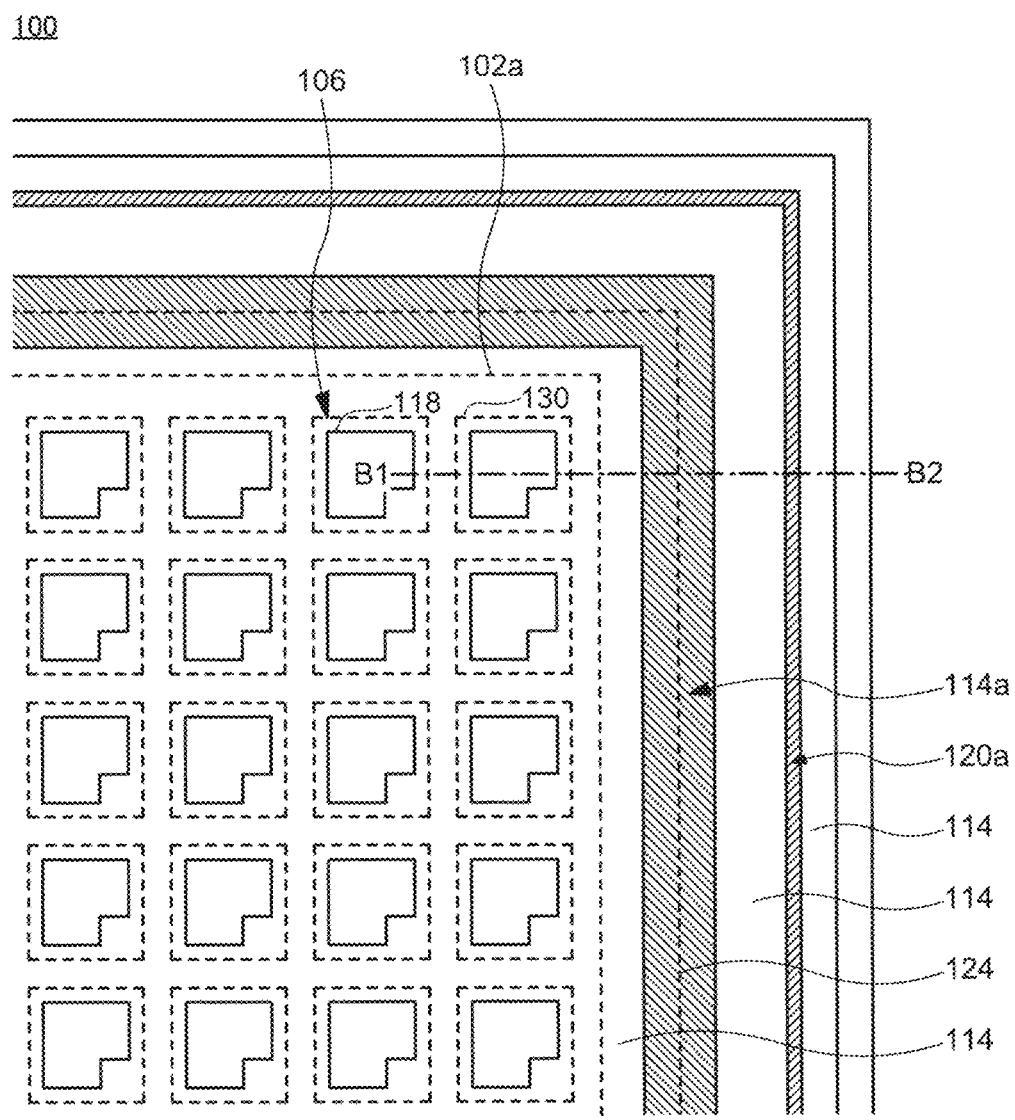
FIG. 3 is a planar diagram for explaining a structure of a display device related to one embodiment of the present invention.
Figure 4:
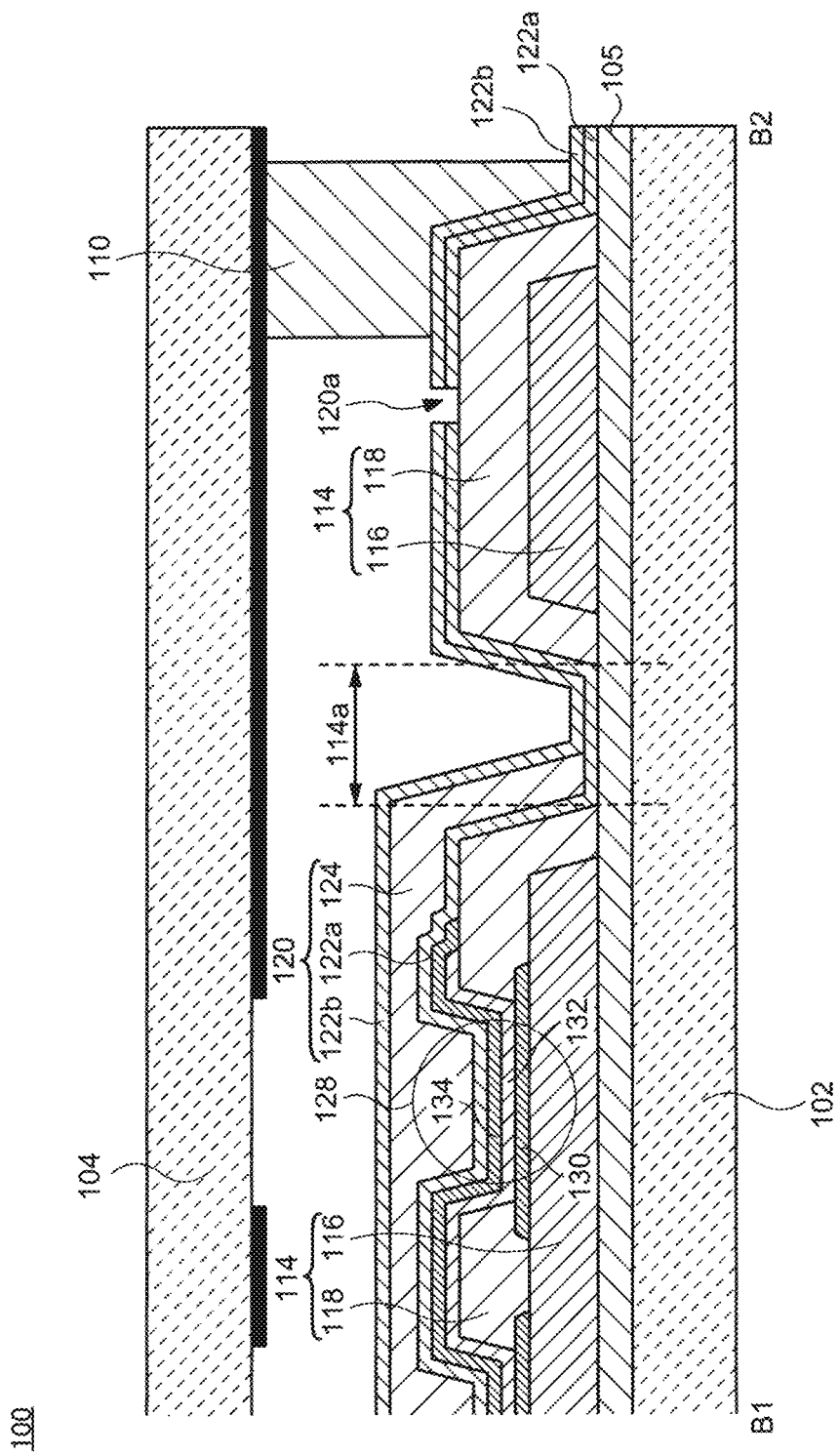
FIG. 4 is a cross-sectional diagram for explaining a structure of a display device related to one embodiment of the present invention.

FIG. 1 is a perspective diagram for explaining a structure of a display device 100 according to the present embodiment. FIG. 2 is a planar diagram for explaining the structure of the display device 100 according to the present embodiment. FIG. 3 is a planar diagram for explaining the structure of the display device 100 according to the present embodiment and is a planar diagram of an enlarged region "A" shown in FIG. 2. FIG. 4 is a cross-sectional diagram for explaining the structure of the display device 100 according to the present embodiment and shows a cross section of the line B1-B2 shown in FIG. 3.

As is shown in FIG. 1, the display device 100 according to the present embodiment includes a first substrate 102, a display region 102a in which a plurality of pixels 106 are arranged, a second substrate 104 which covers the display region 102a, and a sealing material 110. Furthermore, when fixing the second substrate 104 to the first substrate 102, other methods may be used without necessarily using the sealing material 110, and it is not necessary to arrange the sealing material 110 at that time.

The first substrate 102 is used as a support for the plurality of pixels 106. The structure of each of the plurality of pixels 106 is described later. A terminal region 102b is arranged on an end part of a first surface of the first substrate 102 and outside the second substrate 104, and a plurality of connection terminals 108 are arranged. Although not shown in the diagram, a wiring substrate for connecting the display device 100 and a device which outputs image signals or a power supply and the like are connected to the plurality of connection terminals 108. A driver IC 112 for outputting an image signal to a plurality of pixels 106 is mounted on the first substrate 102.

A plate shaped substrate or a substrate having flexibility can be used as the first substrate 102. A glass substrate, an acrylic resin substrate, an alumina substrate, or the like can be used as the plate shaped substrate. A resin material is used as a substrate having flexibility. It is preferred to use a polymer material including an imide bond as a repeating unit, for example, polyimide is used as the resin material. Specifically, a film substrate obtained by molding polyimide into a sheet shape is used as the substrate. Similar to the first substrate 102, a glass substrate or an acrylic resin substrate can be used for the second substrate 104. In addition, the second substrate 104 is not limited to a plate shaped member and may be replaced with a film shaped base material having flexibility or a coating film of a resin material. By providing both the first substrate 102 and the second substrate 104 with a member having flexibility, it is possible to realize the display device 100 having flexibility.

As is shown in FIG. 3, the plurality of pixels 106 are arranged in a first direction and a second direction intersecting the first direction in the display region 102a arranged on the first surface of the first substrate 102. Each of the plurality of pixels 106 includes a pixel circuit having at least a selection transistor, a drive transistor, a light emitting element, and a storage capacitor. FIG. 4 shows a cross-sectional structure corresponding to the line B1-B2 shown in FIG. 3, and the light emitting element 128 is shown among the elements forming the pixel 106.

As is shown in FIG. 4, the light emitting element 128 has a layer structure in which at least a first electrode 130, light emitting layer 132 and a second electrode 134 are stacked in this order from the first substrate 102 side. The light emitting element 128 emits light by applying a forward bias between the first electrode 130 and the second electrode 134. Since an organic EL material is used for the light emitting layer 132 of the light emitting element 128, it is sometimes referred to as an organic EL light emitting element or an organic EL element. Furthermore, the light emitting layer 132 may be arranged so as to emit monochromatic light in common to the plurality of pixels 106, and the plurality of pixels 106 may be arranged corresponding to each color of red (R), green (G), and blue (B). Furthermore, although a detailed structure is omitted in FIG. 4, a circuit element layer 105 forming a pixel circuit and a driving circuit are arranged on the lower layer side (first substrate 102 side) of the light emitting element 128.

As is shown in FIG. 3, the first electrode 130 is arranged in each of the plurality of pixels 106. It is preferred that the material of the first electrode 130 includes a metal layer having a high reflectance in order to reflect light generated in the light emitting layer 132 to the second electrode 134 side. For example, silver (Ag), an alloy containing silver, aluminum an alloy containing aluminum, or the like can be used as the metal layer having a high reflectance.

The first electrode 130 may further be stacked with a transparent conductive layer in addition to the metal layer having a high reflectance as described above. ITO (tin oxide-added indium oxide), IZO (indium oxide-zinc oxide), or the like having translucency and conductivity is preferably used as the transparent conductive layer. In addition, any combination of these may be used.

As is shown in FIG. 4, a second electrode 134 is arranged across the plurality of pixels 106. ITO (tin oxide-added indium oxide) or IZO (indium oxide-zinc oxide) which has translucency to transmit light generated in the light emitting layer 132 and has conductivity are preferred as the material of the second electrode 134. Alternatively, a metal layer having a thickness sufficient to transmit emitted light may be used as the second electrode 134. Furthermore, the second electrode 134 may be formed separately for each of the first electrodes 130.

The first electrode 130 and the second electrode 134 are also respectively referred to as a pixel electrode and a common electrode. In the present embodiment, the first electrode 130 and the second electrode 134 each function as an anode and a cathode. However, the invention is not limited to this structure and the first electrode 130 and the second electrode 134 may function as a cathode and an anode respectively.

As is shown in FIG. 4, the light emitting layer 132 is sandwiched between the first electrode 130 and the second electrode 134. An organic EL material which emits light when a current is supplied can be used as a material of the light emitting layer 132. A low molecular type or high molecular type organic material can be used as the organic EL material. In the case of using a low molecular organic material, the light emitting layer 132 may contain, in addition to the light emitting organic material, a hole injecting layer, an electron injecting layer, a hole transporting layer or an electron transporting layer and the like.

As is shown in FIG. 4, a first organic insulating layer 114 is arranged above the first substrate 102. In the present embodiment, the first organic insulating layer 114 refers to a layer including a planarization insulating layer 116 and a bank layer 118. The first organic insulating layer 114 partially contacts at least one of the first electrode 130, the light emitting layer 132 and the second electrode 134. The planarization insulating layer 116 is arranged between the first electrode 130 and the first substrate 102. The planarization insulating layer 116 is arranged in order to planarize irregularities caused by transistors, wirings or the like (not shown in the diagram) arranged in a layer below. An organic insulating material can be used as the material of the planarization insulating layer 116. For example, a polyimide resin, an acrylic resin or a combination thereof or the like can be used as the organic insulating material.

The bank layer 118 partitions each of the plurality of pixels 106.

Specifically, the bank layer 118 is in contact with the planarization insulating layer 116 and is in contact with an upper end part of the surface of the first electrode 130 on a side where the light emitting layer 132 is arranged. The bank layer 118 is arranged between two adjacent first electrodes 130 and partitions two adjacent pixels 106. It is preferred to use an insulating material as the material of the bank layer 118. For example, a polyimide resin, an acrylic resin or a combination thereof or the like can be used as the organic insulating material for forming the bank layer 118.

By arranging the bank layer 118 formed from an insulating material, it is possible to prevent short circuits between the second electrode 134 and the first electrode 130 at the end part of the first electrode 130. Furthermore, it is possible to reliably insulate adjacent pixels 106.

As is shown in FIG. 2 and FIG. 3, the first organic insulating layer 114 is arranged with a first opening part 114a which exposes the plurality of pixels 106 and passes through the first organic insulating layer 114. The planarization insulating layer 116 and the bank layer 118 are separated into the inside and the annular shaped first opening part 114a as a boundary (see FIG. 4). In this way, in the display device 100, the first opening part 114a forms an annular groove which divides the first organic insulating layer 114 into the pixel region 102a in which the plurality of pixels 106 are arranged and a periphery region on the outer side thereof. When an outer peripheral part of the organic insulating layer is exposed to the air, that part can become a moisture infiltration path and by including such a first opening part 114a. However, the first opening part 114a can block an infiltration path for moisture from the outside to the inside of the first opening part 114a. In this way, it is possible to prevent deterioration of the pixels 106 arranged inside the first opening part 114a, and the reliability of the display device 100 is improved.

The display device 100 according to the present embodiment may further include a drive circuit which is arranged outside the first opening part 114a and drives the plurality of pixels 106.

As is shown in FIG. 4, a sealing layer 120 is arranged in a layer further above the first organic insulating layer 114. The sealing layer 120 covers a side wall and bottom of the first opening part 114a. An end part of the sealing layer 120 is arranged outside the first opening part 114a. Furthermore, the sealing layer 120 covers an end part of the first organic insulating layer 114. In the present embodiment, the sealing layer 120 has regions including a first inorganic insulating layer 122a, a second organic insulating layer 124 and a second inorganic insulating layer 122b in this order from the first substrate 102 side.

The first inorganic insulating layer 122a provided on the lower side of the second organic insulating layer 124 is arranged so that the second organic insulating layer 124 which is easily permeable to moisture, does not come into contact with the light emitting element 128. Therefore, an insulating material having low moisture permeability is preferred as the material of the first inorganic insulating layer 122a. As specific examples of the material of the first inorganic insulating layer 122a, silicon oxide ($SiO_x$), silicon nitride ($SiN_x$), silicon oxynitride ($SiO_xN_y$), silicon nitride oxide ($SiN_xO_y$), aluminum oxide ($AlO_x$), aluminum nitride ($AlN_x$), aluminum oxynitride ($AlO_xN_y$) and aluminum nitride oxide ($AlN_xO_y$) can be used (x and y are arbitrary). In addition, a structure in which these layers are stacked may be used. A plasma CVD method, a sputtering method, or the like can be used as a method for forming the first inorganic insulating layer 122a.

The second organic insulating layer 124 is arranged above the first inorganic insulating layer 122a. In addition, the second organic insulating layer 124 is arranged in a region where an end part thereof overlaps the first opening part 114a. That is, the second organic insulating layer 124 is wider than the light emitting layer 132 in a planar view and is arranged so as to completely cover the light emitting layer 132.

The second organic insulating layer 124 is arranged to planarize irregularities caused by the plurality of light emitting elements 128 arranged under the sealing layer 120 or the bank layer 118 and the like. When these irregularities are not sufficiently planarized and the second inorganic insulating layer 122b is arranged above the second organic insulating layer 124, the second inorganic insulating layer 122b may not sufficiently cover the irregularities of the second organic insulating layer 124, defects such as cracks may be generated in the second inorganic insulating layer 122b, and a moisture infiltration path due to the defect may be generated.

The thickness of the second organic insulating layer 124 is preferred to be 10 μm or more and 50 μm or less. When the film thickness of the second organic insulating layer 124 is smaller than this range, the irregularities described above may not be sufficiently planarized. In such a case, the covering properties of the second inorganic insulating layer 122b arranged in the upper layer become insufficient, and a moisture infiltration path such as a crack may be generated in the second inorganic insulating layer 122b. On the other hand, if the film thickness of the second organic insulating layer 124 is larger than this range, the translucency of the sealing layer 120 is reduced which leads to a decrease in the luminance which is observed.

For example, an acrylic resin or an epoxy resin, or the like can be used as the material of the second organic insulating layer 124. A coating method or an evaporation method or the like can be used as a method for forming the second organic insulating layer 124.

The second inorganic insulating layer 122b is arranged above the second organic insulating layer 124. The second inorganic insulating layer 122b is arranged along an upper surface part and an end part of the second organic insulating layer 124 and along an upper surface of the first inorganic insulating layer 122a in an outer region of the second organic insulating layer 124. That is, the second organic insulating layer 124 is sealed by the first inorganic insulating layer 122a and the second inorganic insulating layer 122b. By adopting such a structure, the sealing layer 120 can block the infiltration path of moisture from the outside to the inside of the display device 100 via the second organic insulating layer 124.

It is preferred to use an insulating material having low moisture permeability as the material of the second inorganic insulating layer 122b the same as the first inorganic insulating layer 122a. A plasma CVD method or a sputtering method or the like can be used as a method for forming the second inorganic insulating layer 122b.

Since an organic insulating layer easily becomes a moisture infiltration path, if moisture penetrates to the second organic insulating layer 124, there is concern that the moisture may reach the first inorganic insulating layer 122a and may further enter the light emitting layer 132. In the present embodiment, since the second organic insulating layer 124 secures a high degree of flatness, the second inorganic insulating layer 122b has excellent covering properties so that a moisture infiltration path is difficult to be generated.

As is shown in FIG. 2 and FIG. 3, the sealing layer 120 further has an annular shaped second opening part 120a surrounding the first opening part 114a. The second opening part 120a is arranged on the outer side of the end part of the second organic insulating layer 124. That is, the second opening part 120a is arranged in a region where the first inorganic insulating layer 122a and the second inorganic insulating layer 122b are stacked and passes through the first inorganic insulating layer 122a and the second inorganic insulating layer 122b. As is shown in FIG. 4, the inner side and the outer side of the sealing layer 120 are separated by the second opening part 120a. In the present embodiment, the second opening part 120a is a through-groove which passes through the first inorganic insulating layer 122a and the second inorganic insulating layer 122b and exposes the first organic insulating layer 114.

When micro-cracks are generated in the first inorganic insulating layer 122a and the second inorganic insulating layer 122b, there arises a problem that it grows and spreads. In particular, in a display device which has flexibility, bending stress operates by repeating deformation which leads to a situation where cracks easily grow. As a result, there is a possibility that a moisture infiltration path which reaches the light emitting layer is generated.

However, with the configuration according to the present embodiment, even if cracks are generated in the first inorganic insulating layer 122a or the second inorganic insulating layer 122b on the outer side of the second opening part 120a, the growth of the crack can be stopped by the second opening part 120a and it is possible to prevent cracks from extending in the display region 102a. In other words, even if cracks occur in the first inorganic insulating layer 122a or the second inorganic insulating layer 122b on the outer side of the second opening 120a, the inner side of the second opening part 120a is not influenced by the crack.

Here, as described in detail later, one of the causes why cracks are generated in the first inorganic insulating layer 122a or the second inorganic insulating layer 122b outside the second opening part 120a reside in the step of dividing the mother glass substrate (a substrate on which plurality of panels are formed) into a plurality of substrates. At this time, the first inorganic insulating layer 122a and the second inorganic insulating layer 122b forming the sealing layer 120 are formed on the entire surface of the mother glass substrate. Thus, before dividing the mother glass substrate, by arranging the second opening part 120a in the first inorganic insulating layer 122a and the second inorganic insulating layer 122b, it is possible to prevent cracks generated at the time of division from growing to the inner side of the second opening part 120a. In this way, it is possible to improve the manufacturing yield of the display device 100.

Even if moisture penetrates to the first organic insulating layer 114 from the second opening part 120a, the pixel 106 including an organic material is not arranged on the outer side of the first opening part 114a, and for example, a drive circuit or the like is arranged. Elements such as transistors and capacitors arranged in a drive circuit have high resistance to moisture compared to organic materials. Therefore, moisture entering from the second opening part 120a has little effect on the elements which form a drive circuit. In addition, at this time, since the inside and the outside of the first organic insulating layer 114 are separated by the first opening part 114a, a moisture infiltration path to the inside of the first opening part 114a via the first organic insulating layer 114 does not exist. Therefore, even if the second opening part 120a is arranged, moisture does not enter the display region 102a via the second opening part 120a and the light emitting layer 132 does not deteriorate.

The width of the second opening part 120a is not particularly limited as long as it is arranged on the outer side of the first opening part 114a. However, when the manufacturing process is taken into account, the width of the second opening part 120a is preferred to be 20 μm or more and 40 μm or less. Although described in detail later, the second opening part 120a can be formed by laser processing as an example. At this time, the beam diameter of the laser beam emitted from the laser light source can be set to the range described above by converging using a lens.

Furthermore, in the present embodiment, as is shown in FIG. 2 and FIG. 3, although the second opening part 120a is arranged to singly surround the first opening part 114a in a planar view, the present invention is not limited to this structure. A plurality of second opening parts 120a may be arranged to doubly surround or more the first opening part 114a in a planar view.

As is shown in FIG. 4, the second substrate 104 is arranged on the upper surface of the display region 102a of the first substrate 102 so as to face the first substrate 102. The second substrate 104 is fixed to the first substrate 102 by a sealing material 110. Any substrate that can be used as the first substrate 102 described above can be used as the second substrate 104.

The sealing material 110 surrounds the periphery part of the second substrate 104 and fixes the first substrate 102 and the second substrate 104 together. The plurality of pixels 106 arranged on the first substrate 102 are sealed so as not to be exposed to the air by the second substrate 104 and the sealing material 110. By such a sealing structure, deterioration of the light emitting element 128 included in each of the plurality of pixels 106 is suppressed. Furthermore, when fixing the second substrate 104 to the first substrate 102, other methods may be used without necessarily using the sealing material 110, and it is not necessary to arrange the sealing material 110 at that time. For example, a filler may be arranged between the first substrate 102 and the second substrate 104 to seal the plurality of pixels 106. In addition, the second substrate 104 may be omitted and the plurality of pixels 106 may be sealed by a sealing resin layer.

According to the structure of the display device 100 according to the present embodiment, even if cracks are generated in the sealing layer 120 at the periphery edge part of the display device 100 and grow, it is possible for this growth to be stopped by the second opening part 120a. Even if a crack is generated in the sealing layer 120 at the periphery edge part of the display region 102a, a moisture infiltration path due to the crack is not formed inside the second opening part 120a. Therefore, it is possible to provide the display device 100 with improved resistance to the entrance of moisture.

Figure 5:
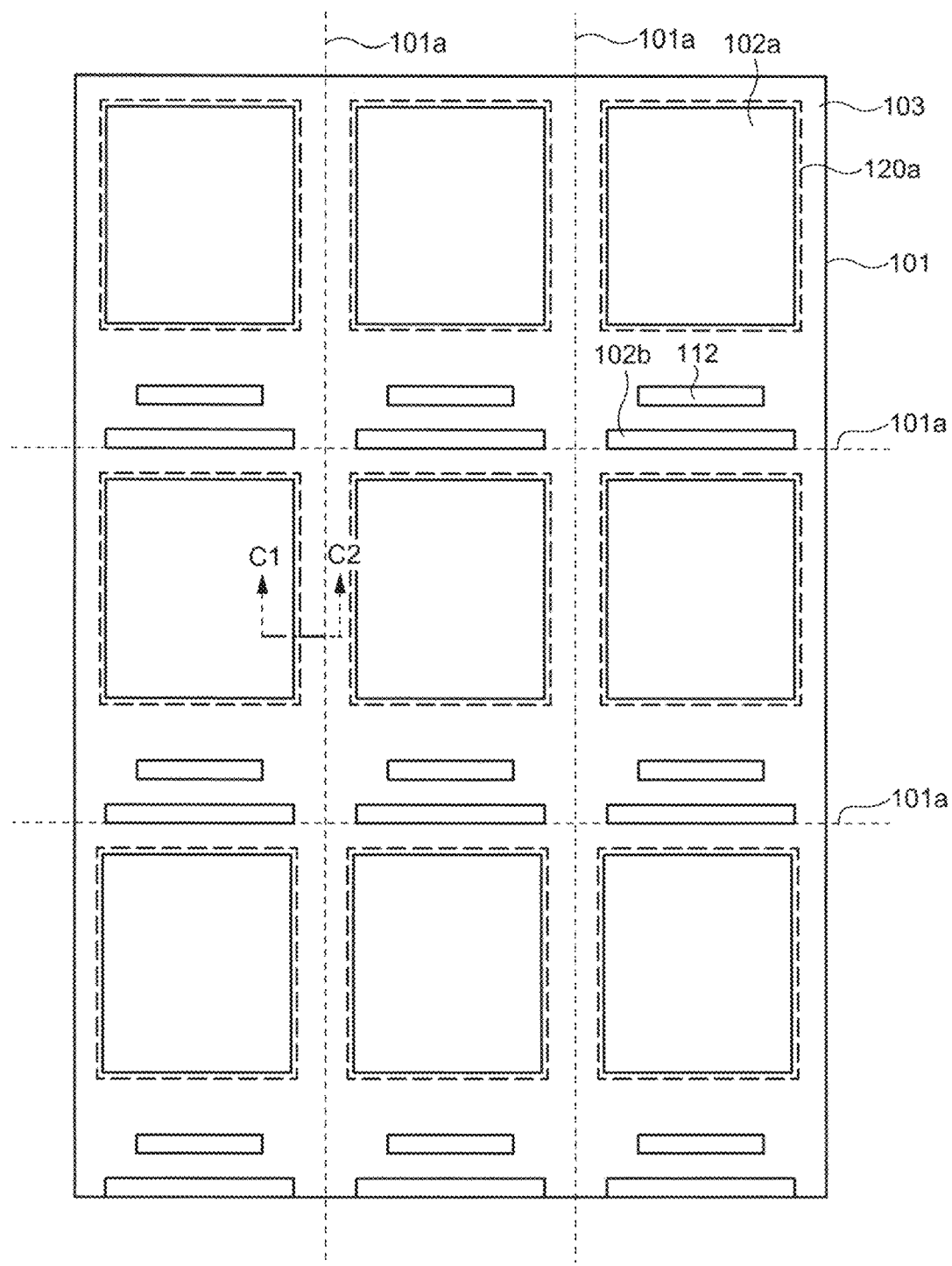
FIG. 5 is a planar diagram for explaining a manufacturing method of a display device related to one embodiment of the present invention.

A method of manufacturing the display device 100 according to the present embodiment is explained in detail while referring to the diagrams. FIG. 5 is a planar diagram for explaining a manufacturing method of the display device 100 according to the present embodiment. FIG. 6A to FIG. 6E are cross-sectional diagram for explaining a method of manufacturing the display device 100 according to the present embodiment. FIG. 5 shows an aspect in which a plurality of display panels 103 are built in a mother glass substrate 101 which is also called mother glass. The display panel 103 includes a display region 102a, a terminal region 102b and a region in which a driver IC 112 is mounted.

FIG. 5 and FIG. 6A are a planar diagram and a cross-sectional diagram respectively showing a state in which a bank layer 118 is formed. Here, FIG. 6A shows a cross-section along a line C1-C2 in FIG. 5. That is, in the processes so far, circuit elements are formed corresponding to each of the plurality of display panels 103 on the mother glass substrate 101, a planarization insulating layer 116 is formed on substantially the entire surface of the mother glass substrate 101, and the first electrode 130 and the bank layer 118 are formed in respective regions of the plurality of display panels 103. Here, by patterning the planarization insulating layer 116 and the bank layer 118, the first opening part 114a is formed on the mother glass substrate 101. The first opening part 114a is arranged to surround the plurality of pixels 106 in each region divided into each of the plurality of display panels 103.

Figure 6B:
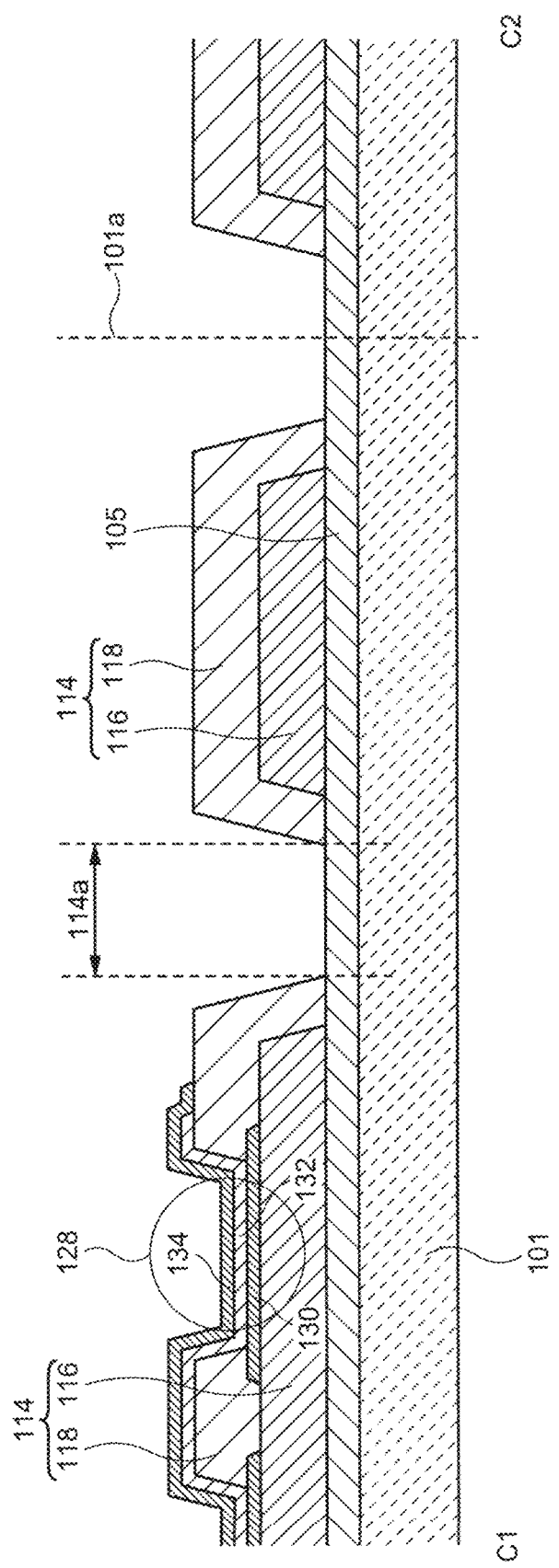
FIG. 6B is a cross-sectional diagram for explaining a manufacturing method of a display device related to one embodiment of the present invention.

Next, a light emitting element 128 is formed (FIG. 6B). The first electrode 130 is formed in the stage shown in FIG. 6A. In this state, the light emitting layer 132 is formed and the second electrode 134 is formed above the light emitting layer 132 so as to cover the plurality of pixels 106. The light emitting layer 132 may include a hole injection layer, a hole transport layer, an electron injection layer and an electron transport layer and the like in addition to an actual light emitting layer from which light emitting molecules are excited. Furthermore, the light emitting layer 132 and the second electrode 134 are not limited to the layout as in the present embodiment and may be formed for each pixel 106. In this step, it is preferred that the light emitting layer 132 is not formed in a region that becomes the first opening part 114a and a dividing line 101a.

Figure 6C:
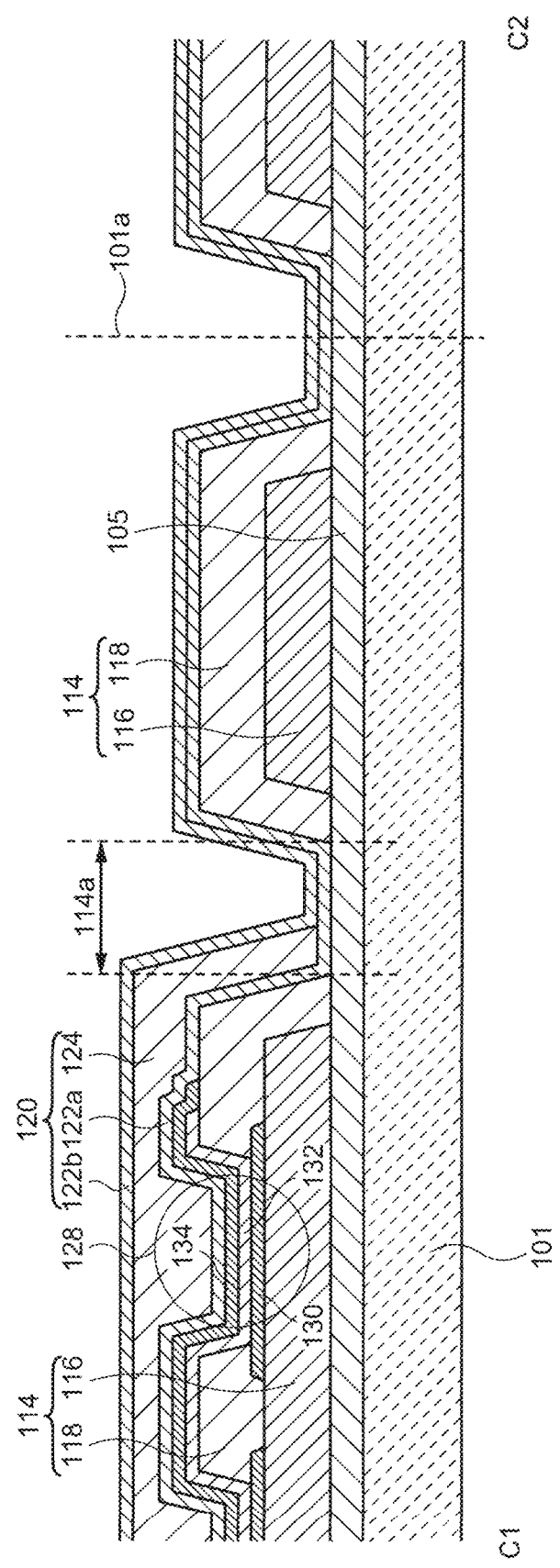
FIG. 6C is a cross-sectional diagram for explaining a manufacturing method of a display device related to one embodiment of the present invention.

Next, a sealing layer 120 is formed (FIG. 6C). In the present embodiment, the sealing layer 120 is formed in order of the first inorganic insulating layer 122a, the second organic insulating layer 124 and the second inorganic insulating layer 122b from a lower layer.

An insulating material having low moisture permeability is preferred as the material of the first inorganic insulating layer 122a. As specific examples of the material of the first inorganic insulating layer 122a, silicon oxide ($SiO_x$), silicon nitride ($SiN_x$), silicon oxynitride ($SiO_xN_y$), silicon nitride oxide ($SiN_xO_y$), aluminum oxide ($AlO_x$), aluminum nitride ($AlN_x$), aluminum oxynitride ($AlO_xN_y$) and aluminum nitride oxide ($AlN_xO_y$) and the like can be used (x and y are arbitrary). In addition, a structure in which these layers are stacked may be used. The first inorganic insulating layer 122a is formed on the entire surface of the mother glass substrate 101. A plasma CVD method or a sputtering method or the like can be used as a method for forming the first inorganic insulating layer 122a.

For example, an acrylic resin or an epoxy resin or the like can be used as the material of the second organic insulating layer 124. The second organic insulating layer 124 is formed so that the end part thereof is positioned within the first opening part 114a in each of the regions which are divided into the plurality of display devices 100. A coating method or an evaporation method or the like can be used as a method for forming the second organic insulating layer 124. Patterning is performed by a photolithography process after formation of the second organic insulating layer 124. Here, the end part of the second organic insulating layer 124 is formed so as to be positioned within the first opening part 114a in each of the regions which are divided into the plurality of display devices 100.

The same material as that of the first inorganic insulating layer 122a can be used as the material of the second inorganic insulating layer 122b. Similar to the first inorganic insulating layer 122a, the second inorganic insulating layer 122b is also formed on the entire surface of the mother glass substrate 101. A plasma CVD method or a sputtering method or the like can be used as a method for forming the second inorganic insulating layer 122b.

Figure 6D:
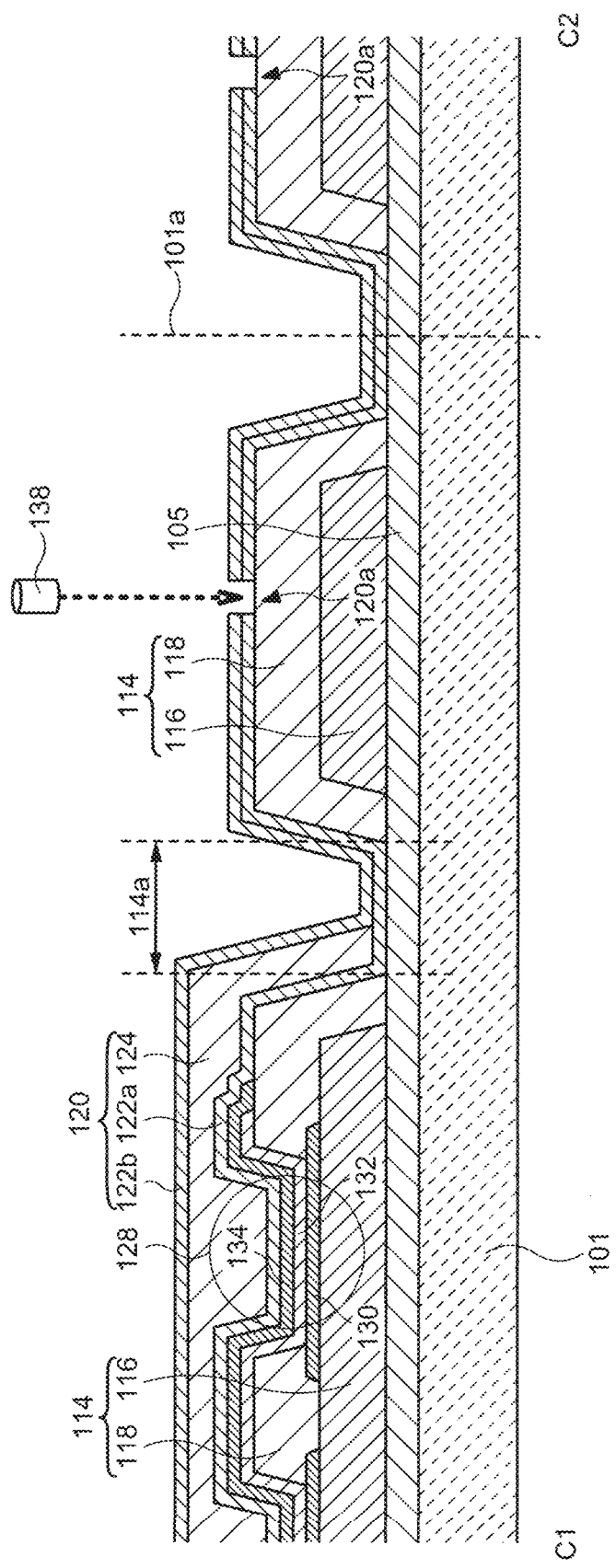
FIG. 6D is a cross-sectional diagram for explaining a manufacturing method of a display device related to one embodiment of the present invention.

Next, a second opening part 120a is formed in the sealing layer 120 (FIG. 6D). The second opening part 120a is formed so as to pass through the first inorganic insulating layer 122a and the second inorganic insulating layer 122b and to surround the first opening part 114a in each of the regions which are divided into the plurality of display devices 100. The second opening part 120a can be formed by laser irradiation. The type of laser light source used is not limited and a YAG laser or excimer laser can be used. In addition, the light beam diameter of the laser may be appropriately used according to the design of the diameter of the second opening part 120a.

Figure 6E:
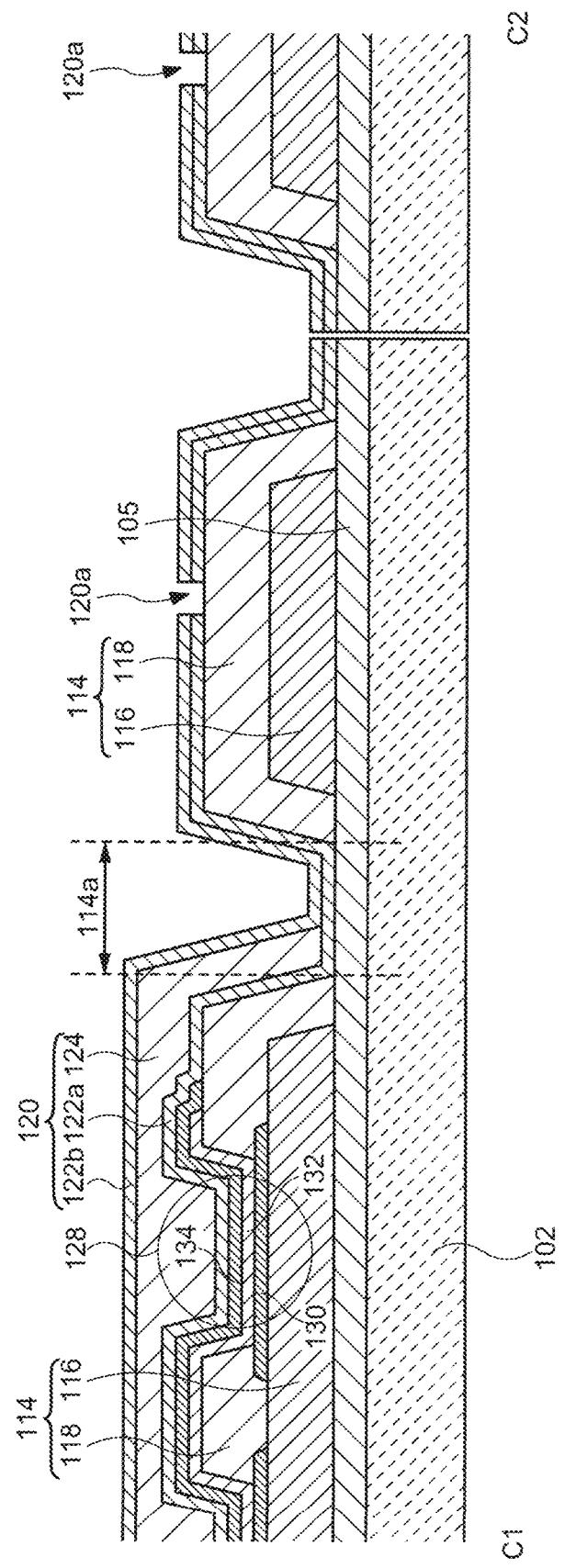
FIG. 6E is a cross-sectional diagram for explaining a manufacturing method of a display device related to one embodiment of the present invention.

Next, the mother glass substrate 101 is divided into a plurality of display devices 100 along the dividing line 101a shown in FIG. 5 (FIG. 6E). It is possible to use blade dicing or laser ablation or the like for dividing the mother glass substrate 101. At this time, even if the mother glass substrate 101 is divided along the dividing line 101a, it is possible to prevent cracks entering the display region 102a by arranging the second opening part 120a in the first inorganic insulating layer 122a and the second inorganic insulating layer 122b. In other words, by arranging the second opening part 120a which passes through the first inorganic insulating layer 122a and the second inorganic insulating layer 122b further to the inner side of the display panel on the mother glass substrate 101 than the dividing line 101a, it is possible to prevent cracks generated from the dividing line 101a from affecting the plurality of pixels 106 arranged in the display region 102a.

Next, the divided substrate and the second substrate 104 are sealed with the sealing material 110 so that the display region 102a is sealed so as not to be exposed to the air, and thereby the display device 100 according to the present embodiment shown in FIG. 4 is obtained.

The preferred forms of the present invention were explained above. However, these are merely examples and are not limited to the technical scope of the present invention. A person ordinarily skilled in the art could perform various modifications without departing from the gist of the present invention and therefore, such modifications are naturally to be interpreted as belonging to the technical scope of the present invention.

What is claimed is:

1. An organic device comprising:
   a first substrate;
   a plurality of pixels above the first substrate, each of the plurality of pixels including a pixel circuit, a first electrode above the pixel circuit, a first organic layer above the first electrode, and a second electrode above the first organic layer;

a first organic insulating layer located between the pixel circuit and the first electrode;

a bank layer comprising an organic material above the first electrode;

a pixel region including the plurality of pixels;

a peripheral region surrounding the pixel region; and a sealing layer above the second electrode and covering the plurality of pixels, wherein the first organic insulating layer is arranged in the pixel region and a peripheral region, the first organic insulating layer includes a first opening surrounding the pixel region, the sealing layer has a stacked structure, the stacked structure is stacked with a first inorganic insulating layer, a second organic insulating layer and a second inorganic insulating layer from the first substrate side, the first inorganic insulating layer, the second organic insulating layer, and the second inorganic insulating layer cover a part of the first opening, the first inorganic insulating layer and the second inorganic insulating layer are in direct contact with each other on the first organic insulating layer in the peripheral region, a second opening which passes through the first inorganic insulating layer and the second inorganic insulating layer in an area where the first inorganic insulating layer and the second inorganic insulating layer are in direct contact with each other on the first organic insulating layer, and surrounds the first opening in a plan view, the second opening is arranged above the first organic insulating layer and the bank layer in the peripheral region, the first inorganic insulating layer and the second inorganic insulating layer are in direct contact with each other in the first opening, the second opening exposes a top surface of the bank layer, the first inorganic insulating layer includes a first portion and a second portion, the second portion of the first inorganic insulating layer is closer to an edge of the first substrate compared to the first portion of the first inorganic insulating layer, and the second opening is located between the first portion of the first inorganic insulating layer and the second portion of the first inorganic insulating layer.

2. The organic device according to claim 1, wherein the second opening is annular shaped.

3. The organic device according to claim 2, wherein a width of the second opening is 20 µm or more and 40 µm or less.

4. The organic device according to claim 1, further including a second substrate on the sealing layer, wherein the first substrate is a first rectangular shape having a first side, a second side, a third side, and a fourth side;

the second substrate is a second rectangular shape having a fifth side, a sixth side, a seventh side, and an eighth side;

a terminal region on the first substrate is arranged between the fourth side and the eighth side, a first edge of the first inorganic insulating layer and another first edge of the second inorganic insulating layer coincide with the first side, a second edge of the first inorganic insulating layer and another second edge of the second inorganic insulating layer coincide with the second side, a third edge of the first inorganic insulating layer and another third edge of the second inorganic insulating layer coincide with the third side, and the first side, the second side, the third side, and the eighth side surround the second opening in a plan view.

5. The organic device according to claim 1, wherein the second opening is located between an outermost edge of the first inorganic insulating layer and the first opening.

6. The organic device according to claim 1, wherein the second opening includes a first edge and a second edge, the second edge of the second opening is closer to an edge of the first substrate compared to the first edge of the second opening, and the first edge of the second opening is located between the first opening and the second edge of the second opening.

* * * * *